(12) United States Patent
Abbaspour et al.

(10) Patent No.: US 7,941,775 B2
(45) Date of Patent: May 10, 2011

(54) ARBITRARY WAVEFORM PROPAGATION THROUGH A LOGIC GATE USING TIMING ANALYSIS RESULTS

(75) Inventors: Soroush Abbaspour, Fishkill, NY (US); Peter Feldmann, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 523 days.

(21) Appl. No.: 12/044,223

(22) Filed: Mar. 7, 2008

(65) Prior Publication Data
US 2009/0228851 A1 Sep. 10, 2009

(51) Int. Cl.
*G06F 17/50* (2006.01)

(52) U.S. Cl. ........ 716/115; 716/108; 716/111; 716/113; 716/134; 703/19

(58) Field of Classification Search .................. 716/4–6, 716/108, 111, 113, 115, 134; 703/19
See application file for complete search history.

(56) References Cited

U.S. PATENT DOCUMENTS

| | | | |
|---|---|---|---|
| 4,495,621 A | 1/1985 | Nakagomi et al. | |
| 6,799,153 B1 * | 9/2004 | Sirichotiyakul et al. | 703/19 |
| 6,836,873 B1 | 12/2004 | Tseng et al. | |
| 7,181,716 B1 * | 2/2007 | Dahroug | 716/13 |
| 7,263,676 B2 | 8/2007 | Gyure et al. | |
| 7,284,212 B2 | 10/2007 | Varshney et al. | |
| 7,359,843 B1 * | 4/2008 | Keller et al. | 703/2 |
| 2003/0079191 A1 | 4/2003 | Savithri et al. | |
| 2006/0190881 A1 | 8/2006 | Su et al. | |
| 2007/0143719 A1 | 6/2007 | Chopra et al. | |

* cited by examiner

*Primary Examiner* — Paul Dinh
*Assistant Examiner* — Nha T Nguyen
(74) *Attorney, Agent, or Firm* — Preston Young; Hoffman Warnick LLC (57) ABSTRACT

An approach for performing arbitrary waveform propagation through a logic gate using timing analysis results is described. In one embodiment, there is an arbitrary waveform propagation tool for determining an effect of noise on a digital integrated circuit having at least one logic gate. A timing analysis component is configured to perform a timing analysis on the at least one logic gate and a noise analysis component is configured to perform a noise analysis. A waveform propagation model synthesizer component is configured to dynamically synthesize a waveform propagation model as a function of the timing analysis. The waveform propagation model synthesizer component is further configured to apply an arbitrary voltage waveform comprising one of a noisy waveform or noise glitch waveform and determine an effect of the arbitrary voltage waveform on the at least one logic gate from the dynamically synthesized waveform propagation model.

20 Claims, 6 Drawing Sheets

ARBITRARY WAVEFORM PROPAGATION THROUGH A LOGIC GATE USING TIMING ANALYSIS RESULTS

BACKGROUND

This invention relates generally to the design automation of Very Large Scale Integrated (VLSI) circuits, and more particularly to determining the effect of noise in digital integrated circuits.

As complementary metal-oxide-semiconductor (CMOS) technology scales down and moves toward deep submicron technologies, the effect of noise in digital circuits becomes critical. Noise can impact the timing results of a circuit and thereby can introduce functional as well as timing failures. For instance, if a noise glitch propagates to the input pin of a dynamic node or a storage circuit such as a latch, it can alter the state of the overall digital circuit and introduce functional error.

In electrical circuits, noise is an extraneous signal that can be generated from capacitively/inductively coupled nets in a digital integrated circuit. An example of a net is a logic signal wire that connects two or more electronic circuit components such as logic gates. One form of noise is crosstalk, which is a signal pickup from a changing voltage on another net. Another form of noise is propagation noise which is the glitch propagated from the input of a victim driver to its output. Propagation noise may combine with the crosstalk noise on the driver output net and further propagate through all the fanout gates. In the design of electric circuits, such as VLSI design, it is important to verify that the noise, which may be induced on a victim net of the chip by its neighboring aggressor nets does not affect the functionality or performance of the circuit.

Typically, noise analysis is used to determine the effect that noise glitches emanating from a victim net will have on a digital circuit. A noisy waveform propagation analysis, which is one type of noise analysis that seeks to understand the effect that propagation noise will have on timing of a victim net, is important in evaluating results from a timing analysis of the circuit. Straightforward techniques that have been used to analyze the effect of propagation noise include a point-based technique, least square error based technique, weighted least square based technique and energy based technique. Generally, all of these techniques approximate the noisy waveform associated with the propagation noise with an effective ramp waveform and then propagate the ramp waveform from the input of a logic gate to the output of a logic gate to determine the effect that the noise has on the delay and slew of the gate. None of these techniques are accurate because the noisy waveform cannot accurately be approximated by an effective ramp waveform. As a result, these techniques may introduce unjustified pessimism during timing analysis of the digital circuit. To avoid the issues associated with approximating the propagation noise with an effective ramp, most glitch propagation analysis techniques require special pre-characterization of the logic gates in the digital circuit. The need to pre-characterize for many combinations of logic gate environments greatly complicates the design flow of a digital circuit and imposes additional burden on the already heavy library characterization effort used by digital circuit designers.

SUMMARY

In one embodiment, there is a method for determining an effect of noise on a digital integrated circuit having at least one logic gate. In this embodiment, the method comprises: performing a timing analysis on the at least one logic gate; performing a noise analysis on the at least one logic gate; dynamically synthesizing a waveform propagation model as a function of the timing analysis, wherein the waveform propagation model is representative of the effect of noise on the timing analysis of the at least one logic gate; applying an arbitrary voltage waveform derived from the noise analysis to the dynamically synthesized waveform propagation model; and determining an effect of the arbitrary voltage waveform on the at least one logic gate from the dynamically synthesized waveform propagation model.

In a second embodiment, there is a computer-readable medium storing computer instructions, which when executed, enables a computer system to determine an effect of noise on a digital integrated circuit having at least one logic gate. In this embodiment, the computer instructions comprises: performing a timing analysis on the at least one logic gate; performing a noise analysis on the at least one logic gate; dynamically synthesizing a waveform propagation model as a function of the timing analysis, wherein the waveform propagation model is representative of the effect of noise on the timing analysis of the at least one logic gate; applying an arbitrary voltage waveform derived from the noise analysis to the dynamically synthesized waveform propagation model; and determining an effect of the arbitrary voltage waveform on the at least one logic gate from the dynamically synthesized waveform propagation model.

In a third embodiment, there is a computer system for determining an effect of noise on a digital integrated circuit having at least one logic gate. The computer system comprises at least one processing unit and memory operably associated with the at least one processing unit. An arbitrary waveform propagation tool storable in memory and executable by the at least one processing unit determines the effect of noise on the digital integrated circuit having at least one logic gate. The arbitrary waveform propagation tool comprises a timing analysis component configured to perform a timing analysis on the at least one logic gate and a noise analysis component configured to perform a noise analysis on the at least one logic gate. A waveform propagation model synthesizer component is configured to dynamically synthesize a waveform propagation model as a function of the timing analysis, wherein the waveform propagation model is representative of the effect of noise on the timing analysis of the at least one logic gate. The waveform propagation model synthesizer component is further configured to apply an arbitrary voltage waveform comprising one of a noisy waveform or noise glitch waveform that is derived from the noise analysis to the dynamically synthesized waveform propagation model and determine an effect of the arbitrary voltage waveform on the at least one logic gate from the dynamically synthesized waveform propagation model.

DETAILED DESCRIPTION

Embodiments of this invention address the issues associated with the currently used glitch propagation analysis techniques by providing a fast and accurate approach to estimating propagation noise induced by a voltage waveform with a non-zero noise glitch at the input of a driving logic gate. In particular, embodiments of this invention estimate the propagation noise based on the behavior of the logic gate under a noiseless timing analysis and a noise analysis. More specifically, embodiments of this invention dynamically synthesize a waveform propagation model as a function of the timing analysis of the logic gate and apply an arbitrary voltage waveform that can be a noisy waveform or a noise glitch waveform derived from a noise analysis of the logic gate to the dynamically synthesized waveform propagation model. In one embodiment, the arbitrary voltage waveform may be derived from the superposition of a noiseless transition and a noise glitch. The effect of the arbitrary voltage waveform on the logic gate is determined from the dynamically synthesized waveform propagation model. This approach avoids the need for complicated pre-characterization of logic gates for noise properties at inputs and outputs under various conditions.

Figure 1A:
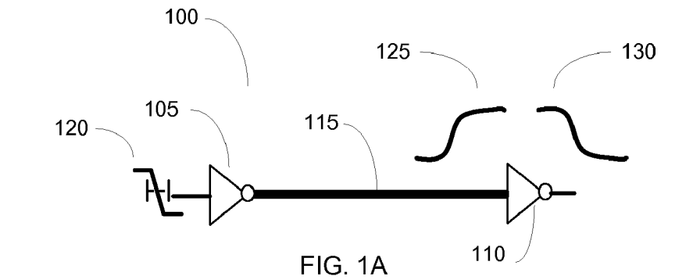
FIGS. 1A-1C shows an example of a glitch propagation analysis of a digital integrated circuit.
Figure 1B:
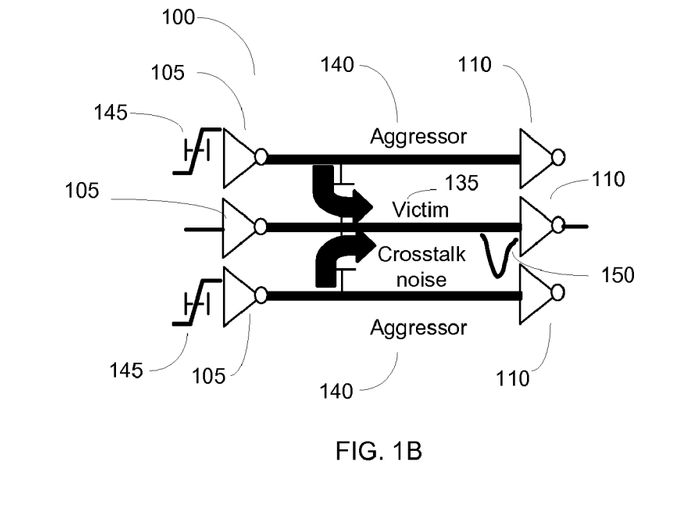
Figure 1C:
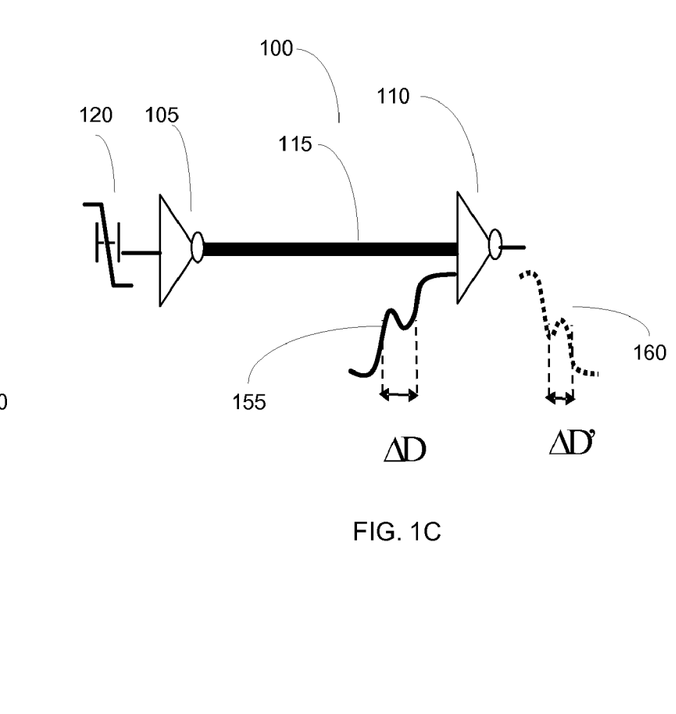

FIGS. 1A-1C show an example of a glitch propagation analysis of digital integrated circuit 100. FIG. 1A shows that the circuit 100 includes a logic gate 105 which is an inverter connected to another logic gate 110 which is also an inverter. A logic signal wire (net) 115 connects gate 105 to gate 110. FIG. 1A shows circuit 100 undergoing a timing analysis such as a static timing analysis (STA). In this STA, gate 105 receives an input voltage waveform 120, which is propagated from the input of gate 105 to an output of the gate. The waveform outputted from gate 105 then propagates to the input of gate 110 taking the shape shown by waveform 125. Waveform 125 propagates through gate 110 to its output and takes the shape of waveform 130. The STA then can use the waveform 130 to calculate metrics such as timing, delay and slew. Note that there is no noise in the STA shown in FIG. 1A.

FIG. 1B shows additional elements of the circuit 100 that are not shown in FIG. 1A. In particular, FIG. 1B shows a victim net 135 and neighboring aggressor nets 140 that are associated with gates 105 and 110. The victim net 135 is quiet and does not have a waveform inputted to gate 105, whereas aggressor nets 140 have an input waveform 145 inputted to gate 105 that is switching from 0 to 1. The aggressor nets 140 effect the victim net 135 by generating crosstalk noise that shows up in FIG. 1B as a noise glitch 150. In FIG. 1B, a noise analysis is performed to analyze the noise glitch 150 and in particular the noise analysis characterizes the waveform associated with the noise glitch 150.

FIG. 1C combines the STA shown in FIG. 1A with the noise analysis shown in FIG. 1B to provide an understanding of how noise will affect timing results. Note that for ease of illustration FIG. 1C does not show the victim net 135 and the aggressor nets 140 shown in FIG. 1B. To determine how noise will affect timing results of the circuit 100, a noisy waveform 155 is inputted to gate 110 and propagated to the output of the gate. As shown in FIG. 1C, a noisy waveform 155, which is derived from the voltage waveform generated in FIG. 1A and the noise glitch generated in FIG. 1B, is inputted to gate 110. The noisy waveform 155 is then propagated through gate 110 to its output taking the shape of waveform 160. The effect that the noise has on the delay is ascertained from the difference in delay of the noisy waveform as it propagates from the input of gate 110 to its output. In FIG. 1C, the difference in delay is determined by looking at the difference in delay ($\Delta D$) in noisy waveform 155 and the difference in delay ($\Delta D'$) of the noisy waveform 160.

Although the above example is described with reference to a noisy waveform, those skilled in the art will recognize that this analysis is suitable for an arbitrary waveform. For example, a glitch waveform generated from coupling noise analysis with a quiet victim could be used in the analysis described herein.

Figure 2:
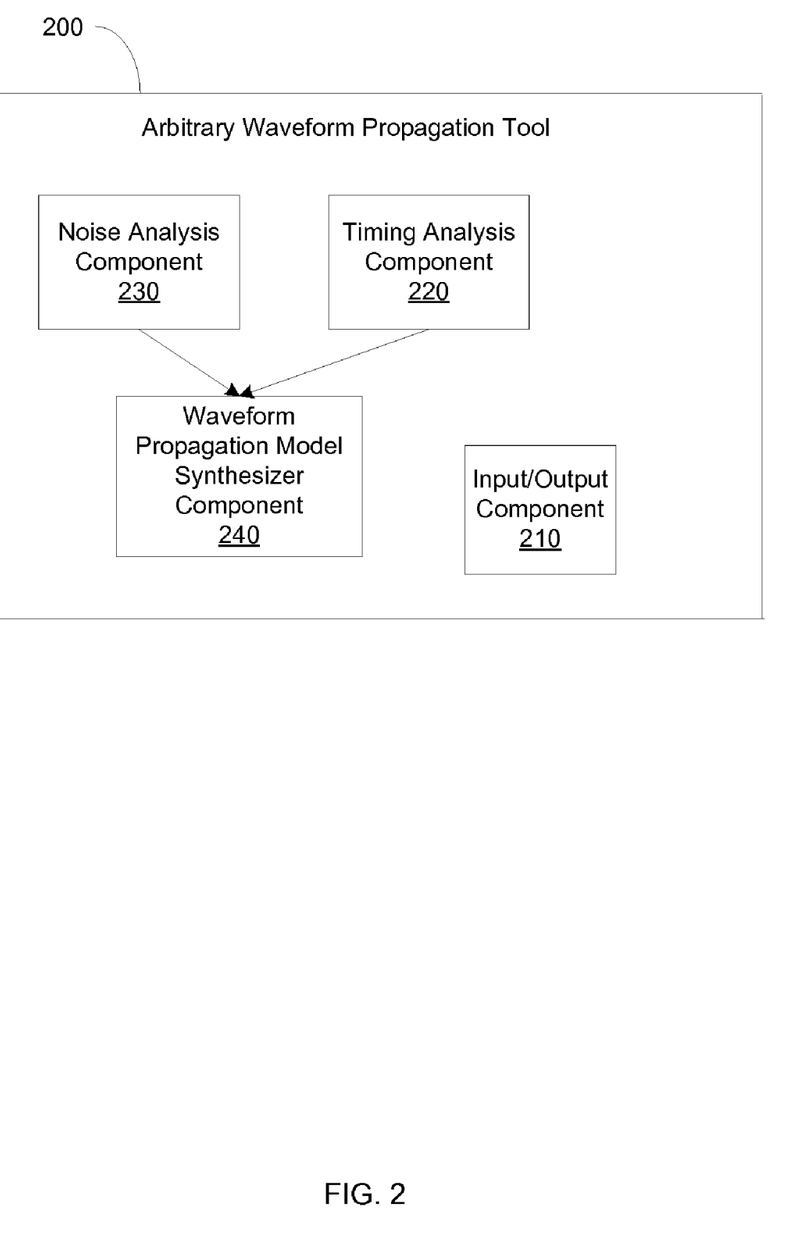
FIG. 2 shows a schematic block diagram of arbitrary waveform propagation tool used to determine the effect of noise on a digital integrated circuit according to one embodiment of the invention.

FIG. 2 shows a schematic block diagram of an arbitrary waveform propagation tool 200 used to determine the effect of noise on a digital integrated circuit according to one embodiment of the invention. The arbitrary waveform propagation tool 200 comprises an input/output component 210 configured to receive input and output. In particular, the input/output component 210 is configured to receive information on digital integrated circuits (e.g., logic gates, arcs of logic gates which are individual input/output pairs that form the gates and interconnect circuits) that will undergo a waveform propagation analysis to provide an understanding on how noise will affect timing results of circuits. A non-exhaustive listing of information that the input/output component 210 may receive that relates to the digital integrated circuits include the type of components in the circuits and their relationships with respect to each other, dimensions of the components, geometries of the components on the circuit, models representing the components, etc. The input/output component 210 is configured to output results from the waveform propagation analysis in the form of time-domain waveforms. These waveforms can be used to determine the effect that noise has on standard timing analysis extracts such as slew, delay, and effective capacitance. Those skilled in the art will recognize that this listing is only illustrative of some of the ways the waveforms can be used.

Referring back to FIG. 2, the arbitrary waveform propagation tool 200 further comprises a timing analysis component 220 configured to perform a timing analysis (e.g., a STA) on the logic gates in the digital circuits received as input by the input/output component 210. In particular, the timing analysis component 220 is configured to propagate a voltage waveform from inputs of the logic gates to their outputs and determine propagation delays of the gates as the voltage waveform propagates from the inputs to the outputs. In addition, the timing analysis component 220 is configured to determine other timing metrics such as slew, arrival times, required arrival times, slacks, and etc.

A noise analysis component 230 is configured to perform a noise analysis on the logic gates in the digital circuits received as input by the input/output component 210. In particular, the noise analysis component 230 runs a noise analysis on the logic gates in the circuits including victim nets and aggressor nets. In one embodiment, the noise analysis component 230 analyzes and characterizes noise glitches that results from the effect that aggressor nets have on victim nets. Other functions performed by the noise analysis component 230 include DC noise calculation, glitch noise propagation and etc.

A waveform propagation model synthesizer component 240 is configured to dynamically synthesize a waveform propagation model as a function of the timing analysis generated by the timing analysis component 220. The dynamically synthesized waveform propagation model is representative of the effect of noise on the timing analysis for the logic gates in the digital circuits. As used herein, the term dynamically is analogous to on-the-fly and means to determine or describe activities that develop or occur contemporaneously rather than as the result of something that is statically predefined. Thus, the waveform propagation model is synthesized dynamically and not created off-line like conventional waveform propagation models. As result, there is no need for pre-characterization data.

In one embodiment of this invention, the waveform propagation model synthesizer component 240 dynamically synthesizes a waveform propagation model from the results of the timing analysis produced by the timing analysis component 220. In particular, the waveform propagation model synthesizer component 240 dynamically synthesizes the waveform propagation model by determining an RC filter representative of the propagation delay of the logic gates. The RC filter captures the low-pass filtering effect of the logic gates in the circuits based on noiseless signal propagation delay. As explained below in more detail, the RC filter is determined as a function of a voltage waveform inputted to the logic gate during the timing analysis and the propagation delay of the logic gate. Again, the input voltage waveform and the propagation delay are obtained from the timing analysis performed by the timing analysis component 220.

In addition, the waveform propagation model synthesizer component 240 is configured to determine a non-linear element of the logic gates which represents the DC transfer characteristics of the circuit in driving a load. As explained below in more detail, the non-linear element is determined as a function of a voltage waveform outputted from the logic gates during the timing analysis and the response that the RC filter has on the voltage waveform inputted to the gates during the timing analysis.

After the waveform propagation model has been synthesized, the waveform propagation model synthesizer component 240 is configured to apply an arbitrary voltage waveform derived from the noise analysis to the waveform propagation model. The arbitrary voltage waveform can comprise a noisy waveform or a noise glitch waveform. In one embodiment, the noisy waveform can be derived from the noise analysis and the timing analysis. In another embodiment, the noise glitch waveform can be derived from only the noise analysis. Using the waveform propagation model, the waveform propagation model synthesizer component 240 is able to determine the effect that the arbitrary voltage waveform has on the logic gates. As explained below in more detail, the waveform propagation model synthesizer component 240 determines an output voltage waveform generated from the dynamically synthesized waveform propagation model in response to the applied arbitrary voltage waveform. The waveform propagation model synthesizer component 240 can then determine noise analysis computations from the output voltage waveform. In one embodiment, the waveform propagation model synthesizer component 240 can determine noise analysis computations that include the effect of noise on the timing analysis of the logic gates, the effect of noise on the slew for the gates and the effect of noise on the delay for the gates. Those skilled in the art will recognize that other computations can be determined such as the effect of noise on the arrival times, required arrival times, slacks, etc.

Although not expressly shown in FIG. 2, all of the components shown in the figure are configured to interact with each other. The components that are shown as being interconnected are illustrated in that manner to convey the close interactions that exist between these components such as the timing analysis component 220, noise analysis component 230 and the waveform propagation model synthesizer component 240.

Figure 3:
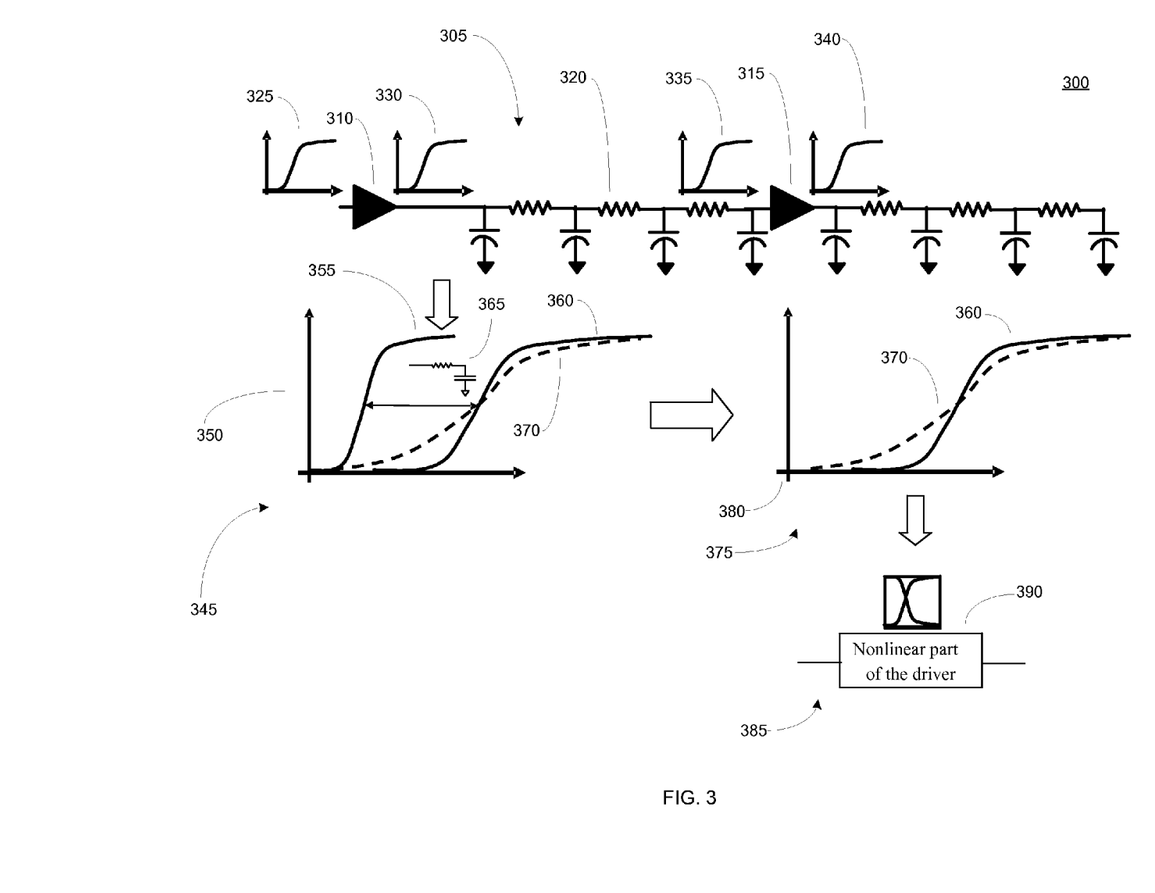
FIG. 3 shows an example of a flow diagram for dynamically synthesizing a waveform propagation model from timing analysis results generated for a digital integrated circuit using the arbitrary waveform propagation tool shown in FIG. 2 according to one embodiment of the invention.

FIG. 3 shows an example of a flow diagram 300 for dynamically synthesizing a waveform propagation model from timing analysis results generated for a digital integrated circuit 305 using the arbitrary waveform propagation tool 200 shown in FIG. 2. In FIG. 3, the circuit 305 includes a logic gate (i.e., a buffer) 310 connected to another logic gate (i.e., a buffer) 315 by an interconnect circuit 320. The arbitrary waveform propagation tool 200 of FIG. 2 performs a timing analysis and noise analysis on the circuit 305. With respect to the timing analysis, an input voltage waveform 325 is propagated from an input of the gate 310 to an output of the gate and takes the shape of voltage waveform 330 shown in FIG. 3. The timing analysis continues with the interconnect circuit 320 which results in a waveform voltage 335 being inputted to gate 315. Gate 315 propagates the voltage waveform 335 to its output where an output voltage waveform 340 is generated. With regard to the noise analysis, this analysis will include victim nets and aggressor nets in addition to logic gates 310 and 315 and interconnect circuit 320. The noise analysis will analyze and characterize noise glitches that results from the effect that aggressor nets have on victim nets in the configuration of circuit 300.

Part 345 of the flow diagram 300 shown in FIG. 3 represents where the waveform propagation model is dynamically synthesized from the timing results obtained from circuit 305. In particular, part 345 shows a graph 350 containing three waveforms 355, 360 and 370. Waveform 355 represents the input voltage waveform 325 inputted to gate 310 and waveform 360 represents the voltage waveform 330 at the output of gate 310 generated by the timing analysis. The waveform propagation model synthesizer component 240 of the arbitrary waveform propagation tool 200 (FIG. 2) uses these two waveforms to derive an RC filter 365. The response of the filter 365 to waveform 355 and 360 match at some point (e.g., a 50% point) along these waveforms. Waveform 370 represents the response of the RC filter 365 to the voltage waveform input 325.

Part 375 of the flow diagram 300 in FIG. 3 shows a graph 380 that specifically details the response (waveform) 370 of the RC filter 365 with respect to the voltage waveform 330 at the output of gate 310 as represented by waveform 360. Part 385 of the flow diagram 300 shown in FIG. 3 represents where the waveform propagation model is dynamically synthesized from the timing results obtained from circuit 305. In particular, part 385 shows the determination of the non-linear element of the driver gate 310. The non-linear element is determined as a function of the response (waveform) 370 of the RC filter 365 with respect to the voltage waveform 360 which represents the voltage waveform 330 at the output of gate 310.

Figure 4:
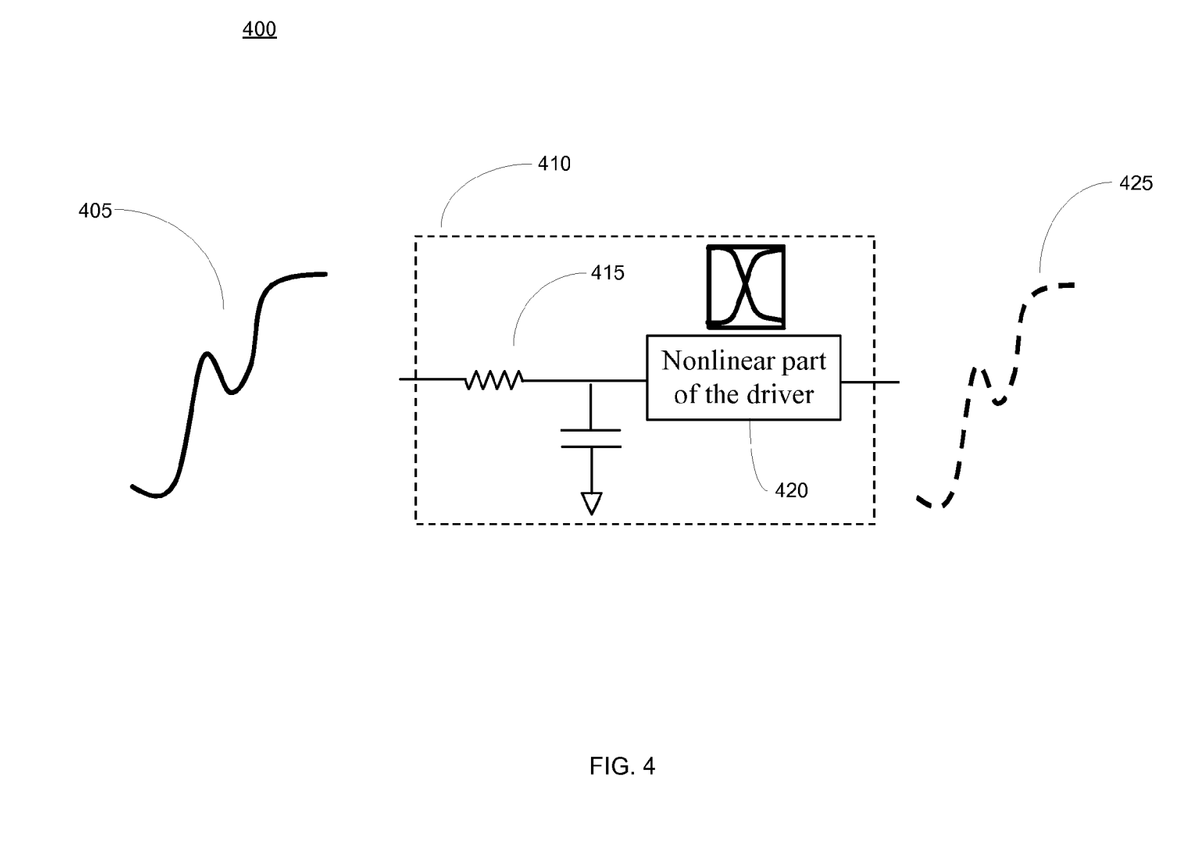
FIG. 4 shows an example of propagating a noisy waveform to the dynamically synthesized waveform propagation model according to one embodiment of the invention.

FIG. 4 shows an example 400 of propagating a noisy waveform 405 to a dynamically synthesized waveform propagation model 410 according to one embodiment of the invention. In this embodiment, the noisy waveform 405 is derived from the noise analysis and the timing analysis in a manner explained below. As shown in FIG. 4, the noisy waveform 405 is applied to the waveform propagation model 410. In particular, the noisy waveform 405 will pass through the RC filter 415 of the waveform propagation model 410 and then the nonlinear part 420 of the model 410. The nonlinear part 420 of the model 410 will generate an output voltage waveform 425. The output voltage waveform can be used to determine noise analysis computations that include glitch noise propagation, the effect of noise on the timing analysis of the logic gates, the effect of noise on the slew for the gates, and the effect of noise on the delay for the gates.

Figure 5:
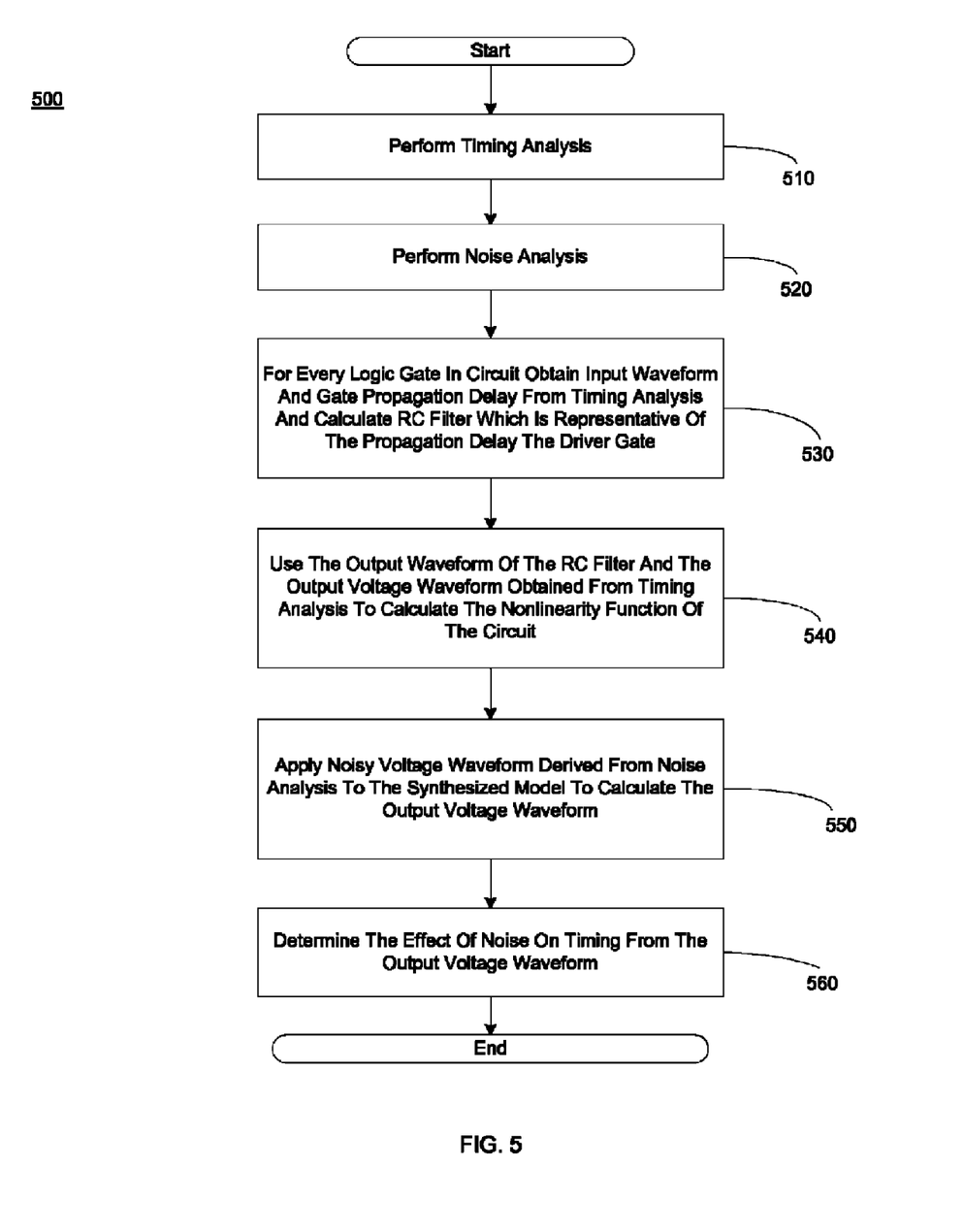
FIG. 5 shows a flow chart describing the process operations performed by the arbitrary waveform propagation tool shown in FIG. 2 according to one embodiment of the invention.

FIG. 5 shows a flow chart 500 describing the process operations performed by the arbitrary waveform propagation tool 200 shown in FIG. 2 for a digital circuit having at least one logic gate according to one embodiment of the invention. The process begins at process block 510 where a timing analysis is performed. The timing analysis includes propagating a voltage waveform from an input of the logic gate to its output and determining propagation delay of the gate as the voltage waveform propagates from the input to the output. In addition, the timing analysis can include determining other timing metrics such as slew, arrival time, required arrival time, slack and etc.

Next in FIG. 5 is the noise analysis which is run at 520. The noise analysis is run on the logic gates in the circuit and includes victim nets and aggressor nets. As mentioned above, the noise analysis analyzes and characterizes noise glitches that results from the effect that aggressor nets have on victim nets, but the analysis generally includes other operations such as DC noise analysis, glitch noise propagation, and etc.

Next, a waveform propagation model is dynamically synthesized as a function of the timing analysis. In particular, at 530, an input voltage waveform and gate propagation delay is obtained from the timing analysis for every logic gate in the circuit. In addition, process block 530 calculates an RC filter representative of the propagation delay of the logic gates in the circuit. In particular, a one-segment RC filter can be synthesized as follows: if the input voltage waveform, $V_{in}^{timing}(t)$, to the RC segment is given, then the output response of the RC segment, $V_{RC}^{timing}(t)$, can be calculated by convolving the input voltage with the impulse response transfer function of the RC segment as:

$$V_{RC}^{timing}(t) = V_{in}^{timing}(t) * [1 - e^{-\frac{t}{RC}}]$$

In addition, given the gate propagation delay, d, solving the following nonlinear equation will determine the time constant of the RC segment:

$$d = V_{RC}^{timing}(t_{50\%}) - V_{in}^{timing}(t_{50\%}) = V_{in}^{timing}(t_{50\%}) * [1 - e^{-\frac{t}{RC}}] - V_{in}^{timing}(t_{50\%})$$

At process block 540, the output waveform of the RC filter and the output voltage waveform obtained from the timing analysis are used to calculate the nonlinear part of the circuit. In particular, given the voltage waveform at the gate output, $V_{out}^{timing}(t)$, and the voltage response of the RC segment, $V_{RC}^{timing}(t)$, then the nonlinear part of the circuit is calculated by calculating the function $f_{non}(v)$ in the following equation:

$$V_{out}^{timing}(t) = f_{non}[V_{RC}^{timing}(t)]$$

After the waveform propagation model has been synthesized, an arbitrary voltage waveform derived from the noise analysis is applied to the waveform propagation model at 550. In one embodiment, the arbitrary voltage waveform is a noisy voltage waveform that is derived from both the noise analysis and the timing analysis. In this embodiment, the noisy voltage waveform, $V^{noisy}(t)$, is derived by superimposing the voltage waveform calculated during static timing analysis, $V^{timing}(t)$, with the voltage waveform calculated during static noise analysis $V^{glitch\ noise}(t)$ as follows:

$$V_{in}^{noisy}(t) = V_{in}^{timing}(t) + V_{in}^{glitch\ noise}(t)$$

In another embodiment, the arbitrary voltage waveform can be a noise glitch waveform that is derived from only the noise analysis.

In addition to applying the arbitrary voltage waveform to the waveform propagation model, process block 550 calculates an output voltage waveform generated from the waveform propagation model in response to receiving the inputted arbitrary voltage waveform. In one embodiment for the noisy waveform, the output voltage waveform is calculated by the following successive operations:

$$V_{RC}^{noisy}(t) = V_{in}^{noisy}(t) * [1 - e^{-\frac{t}{RC}}]$$
$$V_{out}^{noisy}(t) = f_{non}[V_{RC}^{noisy}(t)]$$

Once the output voltage waveform has been obtained it then is used at 560 to determine the effect of noise on the timing analysis of the logic gates in the circuit. In particular, the effect of noise on delay is determined by calculating the difference between the latest 50% crossing time of $V_{out}^{noisy}(t)$ and the 50% crossing time of $V_{out}^{timing}(t)$. Other items that can be readily determined from the output voltage waveform include the effect of noise on the slew for the gates.

The foregoing flow chart shows some of the processing functions associated with performing an arbitrary voltage waveform propagation analysis of a digital integrated circuit. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

Figure 6:
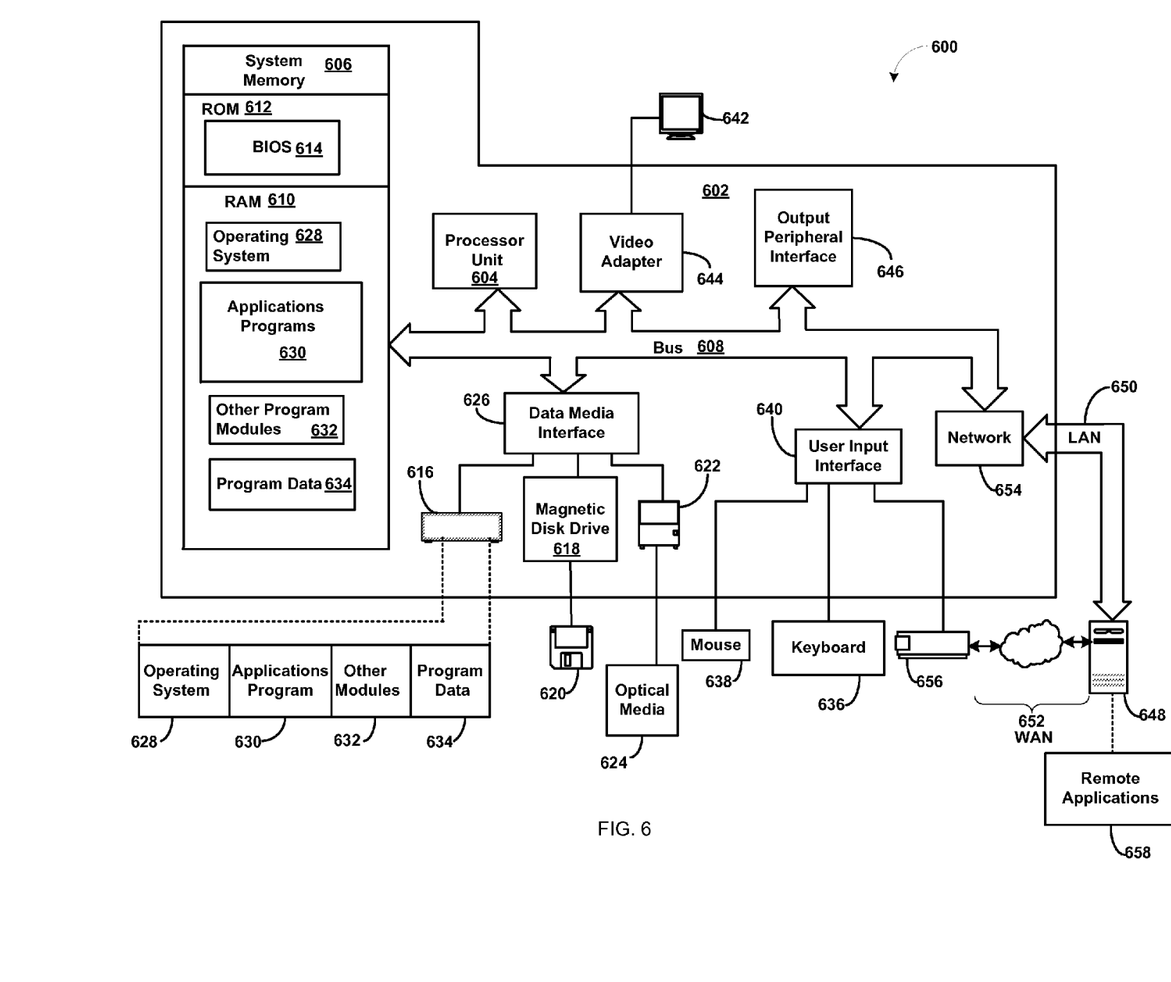
FIG. 6 shows a schematic of an exemplary computing environment in which elements of the arbitrary waveform propagation tool of this invention may operate.

FIG. 6 shows a schematic of an exemplary computing environment in which elements of the arbitrary waveform propagation tool 200 of this invention may operate. The exemplary computing environment 600 is only one example of a suitable computing environment and is not intended to suggest any limitation as to the scope of use or functionality of the approach described herein. Neither should the computing environment 600 be interpreted as having any dependency or requirement relating to any one or combination of components illustrated in FIG. 6.

In the computing environment 600 there is a computer 602 which is operational with numerous other general purpose or special purpose computing system environments or configurations. Examples of well known computing systems, environments, and/or configurations that may be suitable for use with an exemplary computer 602 include, but are not limited to, personal computers, server computers, thin clients, thick clients, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The exemplary computer 602 may be described in the general context of computer-executable instructions, such as program modules, being executed by a computer. Generally, program modules include routines, programs, objects, components, logic, data structures, and so on, that performs particular tasks or implements particular abstract data types. The exemplary computer 602 may be practiced in distributed computing environments where tasks are performed by remote processing devices that are linked through a communications network. In a distributed computing environment, program modules may be located in both local and remote computer storage media including memory storage devices.

As shown in FIG. 6, the computer 602 in the computing environment 600 is shown in the form of a general-purpose computing device. The components of computer 602 may include, but are not limited to, one or more processors or processing units 604, a system memory 606, and a bus 608 that couples various system components including the system memory 606 to the processor 604.

Bus 608 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer 602 typically includes a variety of computer readable media. Such media may be any available media that is accessible by computer 602, and it includes both volatile and non-volatile media, removable and non-removable media.

In FIG. 6, the system memory 606 includes computer readable media in the form of volatile memory, such as random access memory (RAM) 610, and/or non-volatile memory, such as ROM 612. A BIOS 614 containing the basic routines that help to transfer information between elements within computer 602, such as during start-up, is stored in ROM 612. RAM 610 typically contains data and/or program modules that are immediately accessible to and/or presently operated on by processor 604.

Computer 602 may further include other removable/non-removable, volatile/non-volatile computer storage media. By way of example only, FIG. 6 illustrates a hard disk drive 616 for reading from and writing to a non-removable, non-volatile magnetic media (not shown and typically called a "hard drive"), a magnetic disk drive 618 for reading from and writing to a removable, non-volatile magnetic disk 620 (e.g., a "floppy disk"), and an optical disk drive 622 for reading from or writing to a removable, non-volatile optical disk 624 such as a CD-ROM, DVD-ROM or other optical media. The hard disk drive 616, magnetic disk drive 618, and optical disk drive 622 are each connected to bus 608 by one or more data media interfaces 626.

The drives and their associated computer-readable media provide nonvolatile storage of computer readable instructions, data structures, program modules, and other data for computer 602. Although the exemplary environment described herein employs a hard disk 616, a removable magnetic disk 618 and a removable optical disk 622, it should be appreciated by those skilled in the art that other types of computer readable media which can store data that is accessible by a computer, such as magnetic cassettes, flash memory cards, digital video disks, RAMs, ROM, and the like, may also be used in the exemplary operating environment.

A number of program modules may be stored on the hard disk 616, magnetic disk 620, optical disk 622, ROM 612, or RAM 610, including, by way of example, and not limitation, an operating system 628, one or more application programs 630, other program modules 632, and program data 634. Each of the operating system 628, one or more application programs 630 other program modules 632, and program data 634 or some combination thereof, may include an implementation of the arbitrary waveform propagation tool 200 shown in FIG. 2.

A user may enter commands and information into computer 602 through optional input devices such as a keyboard 636 and a pointing device 638 (such as a "mouse"). Other input devices (not shown) may include a microphone, joystick, game pad, satellite dish, serial port, scanner, camera, or the like. These and other input devices are connected to the processor unit 604 through a user input interface 640 that is coupled to bus 608, but may be connected by other interface and bus structures, such as a parallel port, game port, or a universal serial bus (USB).

An optional monitor 642 or other type of display device is also connected to bus 608 via an interface, such as a video adapter 644. In addition to the monitor, personal computers typically include other peripheral output devices (not shown), such as speakers and printers, which may be connected through output peripheral interface 646.

Computer 602 may operate in a networked environment using logical connections to one or more remote computers, such as a remote server/computer 648. Remote computer 648 may include many or all of the elements and features described herein relative to computer 602.

Logical connections shown in FIG. 6 are a local area network (LAN) 650 and a general wide area network (WAN) 652. Such networking environments are commonplace in offices, enterprise-wide computer networks, intranets, and the Internet. When used in a LAN networking environment, the computer 602 is connected to LAN 650 via network interface or adapter 654. When used in a WAN networking environment, the computer typically includes a modem 656 or other means for establishing communications over the WAN 652. The modem, which may be internal or external, may be connected to the system bus 608 via the user input interface 440 or other appropriate mechanism.

In a networked environment, program modules depicted relative to the personal computer 602, or portions thereof, may be stored in a remote memory storage device. By way of example, and not limitation, FIG. 6 illustrates remote application programs 658 as residing on a memory device of remote computer 648. It will be appreciated that the network connections shown and described are exemplary and other means of establishing a communications link between the computers may be used.

An implementation of an exemplary computer 602 may be stored on or transmitted across some form of computer readable media. Computer readable media can be any available media that can be accessed by a computer. By way of example, and not limitation, computer readable media may comprise "computer storage media" and "communications media."

"Computer storage media" include volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media.

The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

It is apparent that there has been provided by this invention an approach for performing arbitrary waveform propagation through a logic gate using timing analysis results. While the invention has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A method, performed on a computer system, for determining an effect of noise on a digital integrated circuit having at least one logic gate, the method comprising:
   using the computer system to perform the following:
      performing a timing analysis on the at least one logic gate;
      performing a noise analysis on the at least one logic gate;
      dynamically synthesizing a waveform propagation model as a function of the timing analysis, wherein the waveform propagation model contains a representation of how noise impacts the timing analysis of the at least one logic gate, wherein the dynamically synthesizing of the waveform propagation model comprises determining a low-pass filtering effect of the at least one logic gate, and determining a non-linear element of the at least one logic gate as a function of a voltage waveform outputted from the at least one logic gate during the timing analysis and the response that the low-pass filtering effect has on a voltage waveform inputted to the at least one logic gate during the timing analysis;
      applying an arbitrary voltage waveform derived from the noise analysis to the dynamically synthesized waveform propagation model; and
      determining an effect of the arbitrary voltage waveform on the at least one logic gate from the dynamically synthesized waveform propagation model.

2. The method according to claim 1, wherein the performing of a timing analysis comprises:
   propagating a voltage waveform from an input of the at least one logic gate to an output of the at least one logic gate; and
   determining propagation delay of the at least one logic gate as the voltage waveform propagates from the input of the at least one logic gate to the output of the at least one logic gate.

3. The method according to claim 1, wherein the determining of the low-pass filtering effect comprises determining an RC filter representative of propagation delay of the at least one logic gate.

4. The method according to claim 3, wherein the RC filter is determined as a function of the voltage waveform inputted to the at least one logic gate during the timing analysis and the propagation delay of the at least one logic gate.

5. The method according to claim 1, wherein the dynamically synthesizing of the waveform propagation model comprises determining a non-linear element of the at least one logic gate that is representative of a DC transfer characteristic.

6. The method according to claim 1, wherein the determining of the effect of the arbitrary voltage waveform comprises determining an output voltage waveform generated from the dynamically synthesized waveform propagation model for the applied arbitrary voltage waveform.

7. The method according to claim 6, further comprising determining the effect of noise on the timing analysis of the at least one logic gate from the determined output voltage waveform.

8. The method according to claim 6, further comprising determining the effect of noise on slew for the at least one logic gate from the determined output voltage waveform.

9. The method according to claim 6, further comprising determining the effect of noise on delay for the at least one logic gate from the determined output voltage waveform.

10. The method according to claim 1, wherein the applying of the arbitrary voltage waveform comprises applying a noisy waveform derived from the noise analysis and timing analysis.

11. The method according to claim 1, wherein the applying of the arbitrary voltage waveform comprises applying a noise glitch waveform.

12. A computer-readable storage device storing computer instructions, which when executed, enables a computer system to determine an effect of noise on a digital integrated circuit having at least one logic gate, the computer instructions comprising:
   performing a timing analysis on the at least one logic gate;
   performing a noise analysis on the at least one logic gate;
   dynamically synthesizing a waveform propagation model as a function of the timing analysis, wherein the waveform propagation model contains a representation of how noise impacts the timing analysis of the at least one logic gate, wherein the dynamically synthesizing of the waveform propagation model comprises instructions for determining an RC filter representative of propagation delay of the at least one logic gate, and determining a non-linear element of the at least one logic gate as a function of a voltage waveform outputted from the at least one logic gate during the timing analysis and the response that the RC filter has on a voltage waveform inputted to the at least one logic gate during the timing analysis;
   applying an arbitrary voltage waveform derived from the noise analysis to the dynamically synthesized waveform propagation model; and
   determining an effect of the arbitrary voltage waveform on the at least one logic gate from the dynamically synthesized waveform propagation model.

13. The computer-readable storage device according to claim 12, wherein the performing of a timing analysis comprises instructions for:
   propagating a voltage waveform from an input of the at least one logic gate to an output of the at least one logic gate; and
   determining propagation delay of the at least one logic gate as the voltage waveform propagates from the input of the at least one logic gate to the output of the at least one logic gate.

14. The computer-readable storage device according to claim 12, wherein the RC filter is determined as a function of the voltage waveform inputted to the at least one logic gate during the timing analysis and the propagation delay of the at least one logic gate.

15. The computer-readable storage device according to claim 12, wherein the determining of the effect of the arbitrary voltage waveform comprises instructions for determining an output voltage waveform generated from the dynamically synthesized waveform propagation model for the applied arbitrary voltage waveform.

16. The computer-readable storage device according to claim 15, further comprising instructions for determining noise analysis computations from the determined output voltage waveform, wherein the noise analysis computations comprise the effect of noise on the timing analysis of the at least one logic gate, the effect of noise on the slew for the at least one logic gate and the effect of noise on the delay for the at least one logic gate.

17. A computer system for determining an effect of noise on a digital integrated circuit having at least one logic gate, comprising:
at least one processing unit;
memory operably associated with the at least one processing unit; and
an arbitrary waveform propagation tool storable in memory and executable by the at least one processing unit for determining the effect of noise on the digital integrated circuit having at least one logic gate, the tool comprising:
a timing analysis component configured to perform a timing analysis on the at least one logic gate;
a noise analysis component configured to perform a noise analysis on the at least one logic gate; and
a waveform propagation model synthesizer component configured to dynamically synthesize a waveform propagation model as a function of the timing analysis, wherein the waveform propagation model contains a representation of how noise impacts the timing analysis of the at least one logic gate, wherein the waveform propagation model synthesizer component is configured to determine an RC filter representative of propagation delay of the at least one logic gate, wherein the waveform propagation model synthesizer component is configured to determine a non-linear element of the at least one logic gate as a function of a voltage waveform outputted from the at least one logic gate during the timing analysis and the response that the RC filter has on a voltage waveform inputted to the at least one logic gate during the timing analysis, wherein the waveform propagation model synthesizer component is further configured to apply an arbitrary voltage waveform comprising one of a noisy waveform or noise glitch waveform that is derived from the noise analysis to the dynamically synthesized waveform propagation model and determine an effect of the arbitrary voltage waveform on the at least one logic gate from the dynamically synthesized waveform propagation model.

18. The system according to claim 17, wherein the timing analysis component is configured to propagate a voltage waveform from an input of the at least one logic gate to an output of the at least one logic gate and determine propagation delay of the at least one logic gate as the voltage waveform propagates from the input of the at least one logic gate to the output of the at least one logic gate.

19. The system according to claim 18, wherein the RC filter is determined as a function of the voltage waveform inputted to the at least one logic gate during the timing analysis and the propagation delay of the at least one logic gate.

20. The system according to claim 17, wherein the waveform propagation model synthesizer component is further configured to determine an output voltage waveform generated from the dynamically synthesized waveform propagation model for the applied noisy voltage waveform and determine noise analysis computations from the determined output voltage waveform, wherein the noise analysis computations comprise the effect of noise on the timing analysis of the at least one logic gate, the effect of noise on the slew for the at least one logic gate and the effect of noise on the delay for the at least one logic gate.

* * * * *